(12) United States Patent
Wu et al.

(10) Patent No.: US 7,279,767 B2
(45) Date of Patent: Oct. 9, 2007

(54) SEMICONDUCTOR STRUCTURE WITH HIGH-VOLTAGE SUSTAINING CAPABILITY AND FABRICATION METHOD OF THE SAME

(75) Inventors: Chen-Bau Wu, Taipei (TW); Fang-Cheng Lui, Taoyuan (TW); Shun-Liang Hsu, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 170 days.

(21) Appl. No.: 11/048,914

(22) Filed: Feb. 3, 2005

(65) Prior Publication Data

US 2006/0170060 A1   Aug. 3, 2006

(51) Int. Cl.
*H01L 23/58* (2006.01)
(52) U.S. Cl. .............................. 257/487; 257/E29.063; 257/E21.443
(58) Field of Classification Search .................. 257/487
See application file for complete search history.

(56) References Cited

U.S. PATENT DOCUMENTS

| 6,277,675 B1 | 8/2001 | Tung |
| 6,297,082 B1 * | 10/2001 | Lin et al. .................... 438/217 |
| 6,455,893 B1 | 9/2002 | Gehrmann et al. |

* cited by examiner

*Primary Examiner*—Evan Pert
*Assistant Examiner*—Tan Tran
(74) *Attorney, Agent, or Firm*—Birch, Stewart, Kolasch & Birch, LLP (57) ABSTRACT

A semiconductor structure with high-voltage sustaining capability. A semiconductor structure with high-voltage sustaining capability includes a first well region of a first conductivity type. A pair of second well regions of a second conductivity type opposite to the first conductivity type are respectively disposed adjacent to the first well region and an anti-punch through region of the first conductivity type is disposed in at least the lower portion of the first well region to increase the doping concentration therein. Due to the ion supplementation of the anti-punch through region, the size of a semiconductor structure can be further reduced without affecting the HV sustaining capability and undesired effects such as punch-through effects can be prevented.

11 Claims, 8 Drawing Sheets

SEMICONDUCTOR STRUCTURE WITH HIGH-VOLTAGE SUSTAINING CAPABILITY AND FABRICATION METHOD OF THE SAME

BACKGROUND

The present invention relates to a fabrication method for an integrated circuit. More particularly, the present invention relates to a fabrication method for forming a semiconductor structure with high-voltage sustaining capability.

In current integrated circuit processing, controllers, memories, circuits of low-voltage operation and power devices of high-voltage (HV) operation are largely integrated into a single chip to achieve a single-chip system. The power device, such as VDMOS, IGBT and LDMOS, is employed to increase power switching efficiency and decrease the loss of energy resources.

Moreover, many currently available power devices use both NMOS and PMOS high-voltage transistors (hereinafter referred to as HV transistors). In order to achieve HV transistors with a channel length of less than 0.5 µm, by a conventional manufacturing process, it is necessary to appropriately increase the doping of the substrate so as to prevent defects, such as punch-through of undesired electrical connections between two regions having different potentials during operation under high bias and working voltages.

Hence, there is a need for an HV device that can better sustain high-voltage operation and meet the demand of size reduction.

Two different kinds of HV MOS devices are disclosed in U.S. Pat. No. 6,455,893 and U.S. Pat. No. 6,277,675. In U.S. Pat. No. 6,455,893, Gehrmann et. al. disclose a HV PMOS with a drain extension region produced by means of the use for logic MOS transistors. In U.S. Pat. No. 6,277,675, Tung teaches a method of fabricating a high voltage (HV) MOS device on a substrate with an N-type well region and a P-type well region thereon. The method disclosed in U.S. Pat. No. 6,277,675 can control the channel length of the HV MOS device and a higher voltage can be applied to the device without causing electrical breakdown resulting in device damage.

SUMMARY

Accordingly, an object of the invention is to provide a semiconductor structure that can sustain higher operating voltage.

Another object of the invention is to provide an isolation structure that can sustain higher operating voltage.

Another object of the invention is to provide a transistor capable of higher operating voltage.

According to one object of the invention, a semiconductor structure that can sustain high-voltage operation includes a first well region of a first conductivity type. A pair of second well regions of a second conductivity type opposite to the first conductivity type are respectively disposed adjacent to the first well region and an anti-punch through region of the first conductivity type is disposed in at least the lower portion of the first well region to increase the doping concentration therein. The first conductivity can be N-type conductivity or P-type conductivity.

According to another object of the invention, an isolation region such as a field oxide region or STI region is further disposed on the surface of the first well region to form an isolation structure that can sustain higher operating voltage. Interference between devices during HV operation can thus be prevented.

According to another object of the invention, a pair of isolation regions is disposed respectively in the second well region of the described semiconductor structure. A pair of doped regions of the second conductivity type are respectively disposed in the second well regions and a gate dielectric layer and a gate electrode are then sequentially disposed over the surface of the first well region to form a transistor with high-voltage sustaining capability. The first conductivity can be N-type conductivity or P-type conductivity. When the first conductivity is P-type conductivity, an N-channel transistor with high-voltage sustaining capability is thus formed. On the contrary, when the first conductivity is N-type conductivity, a P-channel transistor with high-voltage sustaining capability is thus formed.

In addition, a fabrication method of the described semiconductor structure is disclosed in the present invention. The fabrication method includes the steps of forming at least one first doped layer of a first conductivity type on the surface of a semiconductor substrate. A semiconductor layer of the first conductivity type is formed on the semiconductor substrate. Next, a plurality of second doped layers of the first conductivity type and third doped layers of a second conductivity type are then alternatively formed in the semiconductor layer, wherein each first doped layer is substantially disposed under one of the second doped layers. An annealing process is then performed on the doped layers to form a plurality of first well regions of the first conductivity type, a plurality of second well regions of the second conductivity type and at least one anti-punch through region of the first conductivity type, wherein each anti-punch through region overlaps portions of the lower portion of the first well region thereabove to increase the doping concentration therein, forming a semiconductor structure with high-voltage sustaining capability.

Moreover, the fabrication method further includes the step of selectively forming an isolation region on the surface of the first well region which is partially overlapped by the anti-punch through region to form an isolation structure with high-voltage sustaining capability.

In addition, the fabrication method further includes the steps of selectively forming a pair of isolation regions on the surfaces of the two second well regions adjacent to the first well region which is partially overlapped by the anti-punch through region. Next, a gate dielectric layer and a gate electrode are sequentially formed over the first well region partially overlapped by the anti-punch through region and a pair of node contact regions are then formed in the second well regions respectively to form a transistor with high-voltage sustaining capability.

Due to the ion supplement of the anti-punch through region disclosed in the present invention, size of an isolation structure or an HV transistor can be further reduced without affecting the HV sustaining capability thereof. In addition, undesired effects such as punch-through effects can be prevented and current yields of a HV transistor can be increased.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of ilustration only, and thus are not limitative of the present invention, and wherein.

DESCRIPTION

Figure 1:
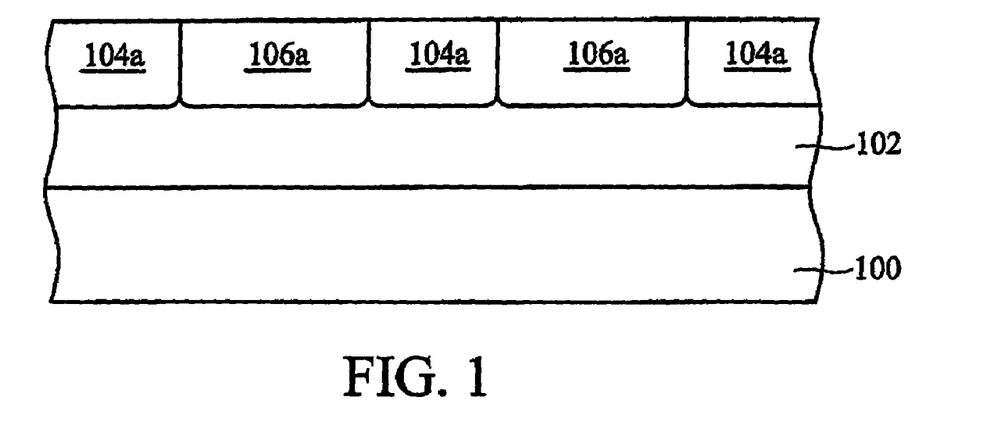
FIGS. 1 and 2 show schematic cross-sectional diagrams illustrating a method of forming an N-channel high voltage (HV) transistor known to the inventors.
Figure 2:
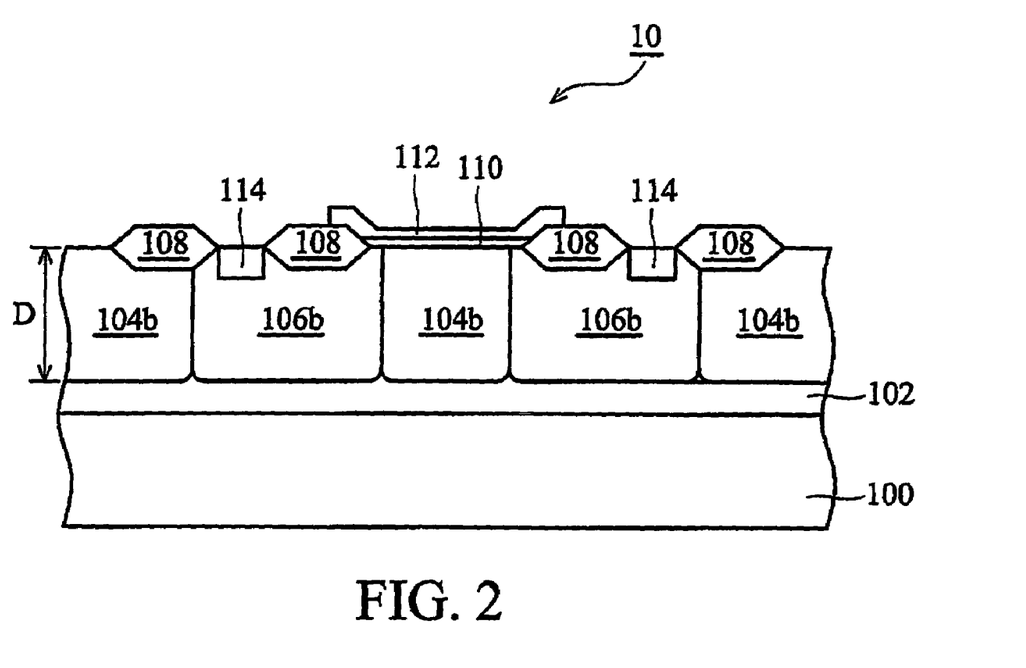

FIGS. 1 and 2 demonstrate a method known to the inventors for forming an N-channel high-voltage (HV) transistor over a semiconductor substrate. This is not prior art for the purpose of determining the patentability of the present invention. This merely shows a problem found by the inventors.

In FIG. 1, a semiconductor substrate with a semiconductor layer thereon is provided. The semiconductor substrate is a substrate of a first conductivity such as a P-type silicon substrate 100 and the semiconductor layer thereon is a P-doped silicon layer 102. The P-doped silicon layer 102 can be formed, for example, by an in-situ doping epitaxy process (not shown). The doping concentration of the P-type ions in the silicon substrate 100 and the silicon layer 102 are substantially the same.

Next, a plurality of P$^+$-doped layers 104a and N-doped layers 106a are alternatively formed in the silicon layer 102 by definitions of proper masks and ion implantations (not shown). The P-type ion concentration in the P$^+$-doped layers 104a are larger than that in the silicon layer 102.

In FIG. 2, a thermal annealing process (not shown) is then performed on the doped layers and a plurality of P well regions 104b and N well regions 106b are then alternatively formed in the silicon layer 102. Next, isolation regions 108 are formed on proper locations respective to the surface of the well regions and a gate dielectric layer 110, a gate electrode layer 112 and contact node regions 114 are then formed to form a transistor 10 through known methods (not shown). The contact node regions 114 are N$^+$-doped regions and respectively act as source or drain regions. The isolation regions 108 can be field oxide (FOX) regions as shown in FIG. 2 or conventional shallow trench isolation (STI) regions. Thus, an N-channel transistor 10 with symmetric source and drain regions is thus formed on the silicon substrate 100. The N-channel transistor 10 can operate with a higher bias of more than 5 volts (V), up to tens or more than a hundred volts (V), and acts as a high-voltage (HV) transistor for use as a power source or device driver.

Figure 3:
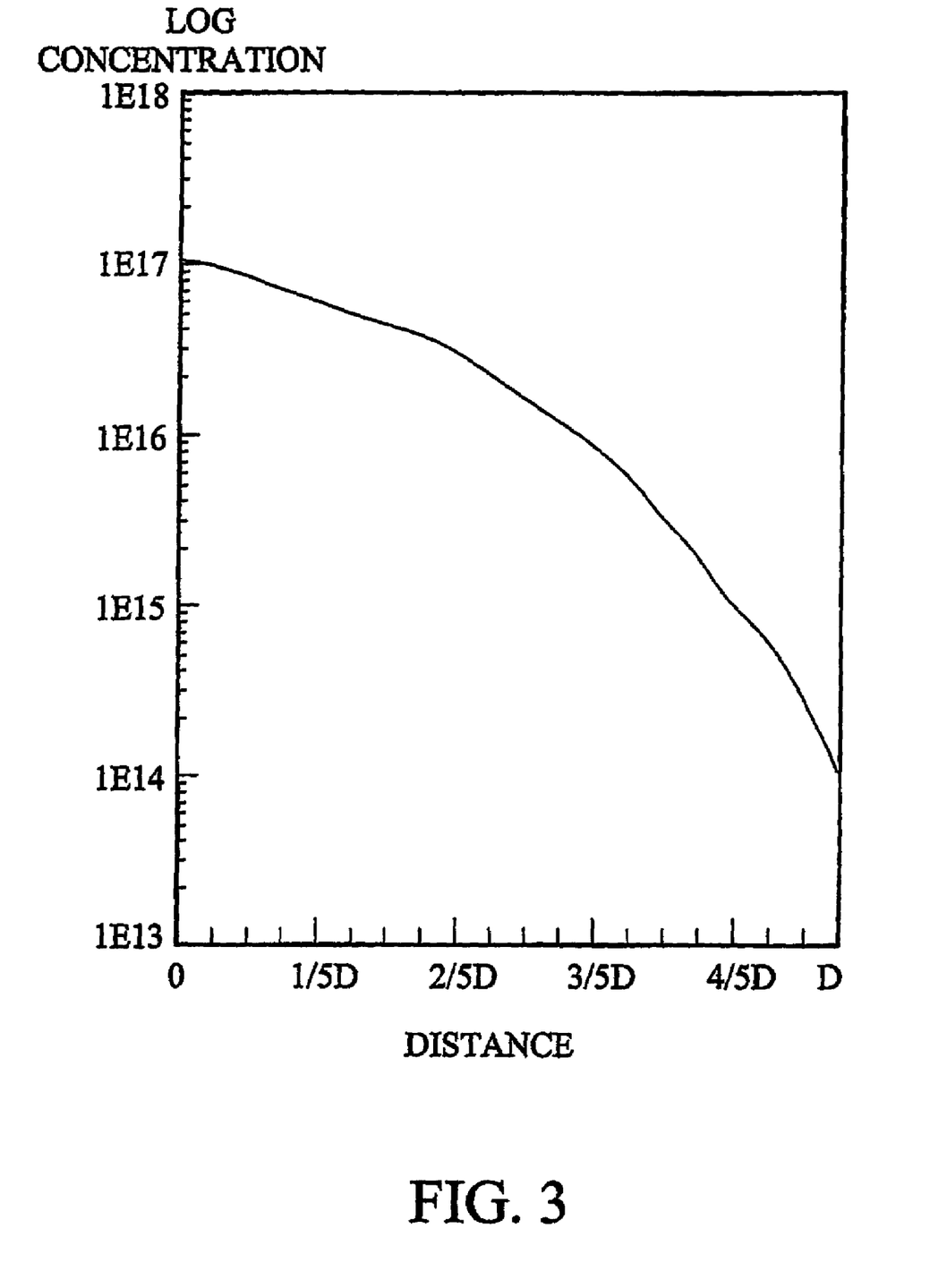
FIG. 3 shows an ion concentration profile of the P well region shown in FIG. 2.

Nevertheless, a channel for the HV transistor is formed near the surface of the P well region 104b under the gate dielectric layer 110, which is diffused by P-type ions such as boron (B). The ion concentration in the P well region 104b vertically decreases with respect to the depth D thereof and a profile of the doping concentration therein is shown in FIG. 3. The depth D of the P well region 104b is about 2–4 µm. FIG. 3 is for illustration only, and is not intended to limit the invention to the quantities described therein. The vertical axis of FIG. 3 represents the P-type ion concentration as the logarithm of the number of ions per cubic centimeter. The horizontal axis of FIG. 3 represents the relative vertical distance into the P-doped layer 102 with respect to the depth D of the P well region 104b. In FIG. 3, the P-type ion concentration drops dramatically and is about 0.1% of the maximum ion concentration therein (normally from 1E17 to 1E14 atoms/cm$^2$) when the distance is near D. When the N-channel transistor 10 is under a higher bias (about 20~100 volts), a potential N-channel may be formed in the lower portion of the P well region 104b and currents may path through this potential channel and punch through the hetero-junctions between the P well region 104b and adjacent N well regions 106b of the lower portion. Thus, the so-called punch through effect occurs in the N-channel transistor 10, causing damage to the N-channel transistor 10.

Thus, the present invention provides a method for fabricating an N-channel transistor that can sustain higher operating voltage and prevent possible punch through effects between the hetero-junctions of the well regions. The fabrication steps are schematically illustrated through FIGS. 4 to 8.

Figure 4:
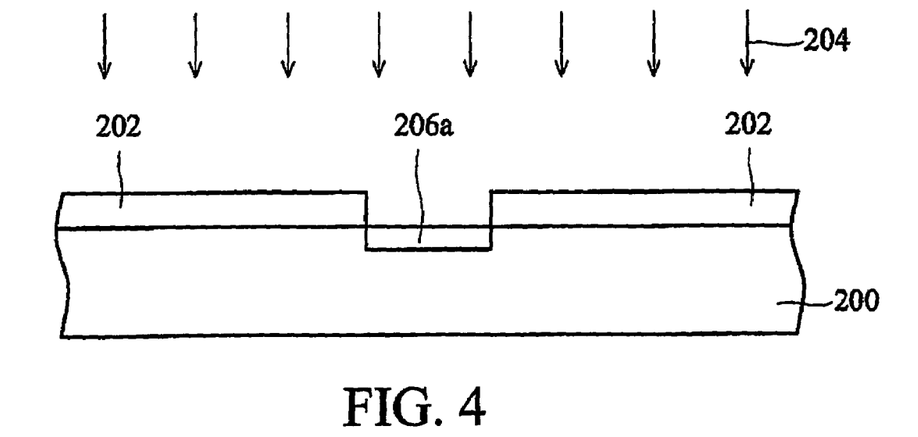
FIGS. 4 to 8 show schematic cross-sectional diagrams illustrating a method of forming an N-channel transistor with high-voltage sustaining capability of the invention.

In FIG. 4, a semiconductor substrate of a first conductivity type such as a P-type silicon substrate 200 is first provided. Patterned masking layers 202 are then formed on the silicon substrate 200 to expose a portion of the surface of the silicon substrate 200. The patterned masking layers 202 can be photoresist (PR) layers or oxide layers. Next, an ion implantation process 204 is performed to implant P-type ions into the silicon substrate 200 to form a first doping layer 206a in the silicon substrate 200. Preferably, the P-type ions used in the ion implantation process 204 are boron (B).

Figure 5:
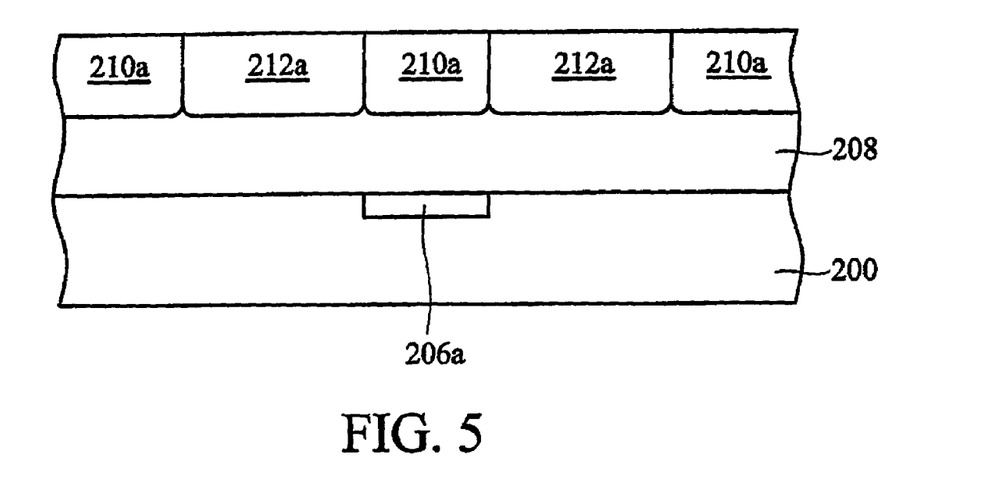

In FIG. 5, a semiconductor layer with the same conductivity type of the substrate, for example a P-doped silicon layer 208 is then formed on the silicon substrate 200 through, for example, an in-situ doping epitaxy process (not shown). Next, a plurality of P$^+$-doped layers 210a and N-doped layers 212a are alternatively formed in the silicon layer 208 by proper masking processes and ion implantation steps (not shown). Here, one of the P$^+$-doped layer 210a is substantially formed above the first doping layer 206a.

Figure 6:
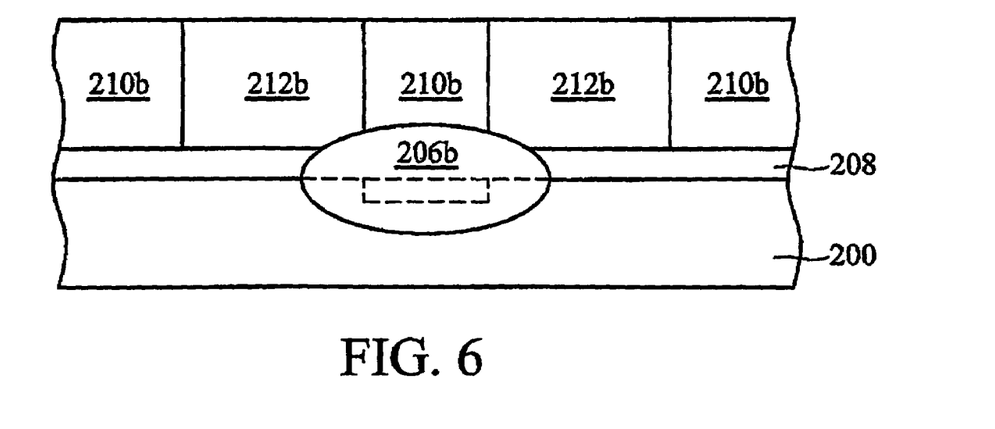

In FIG. 6, a thermal annealing process (not shown) is then performed on the described doped layers and the first doping layer 206a therebelow. A plurality of P well regions 210b and N well regions 212b are thus alternatively formed in the silicon layer 208. Moreover, a P$^+$-doped region 206b is further diffused to overlap the lower portion of one of the P well regions 210b and portions of two adjacent N well regions 212b thereof. The P$^+$-doped region 206b also diffuses into portions of the P-doped layer 208 and the silicon substrate 200.

Figure 7:
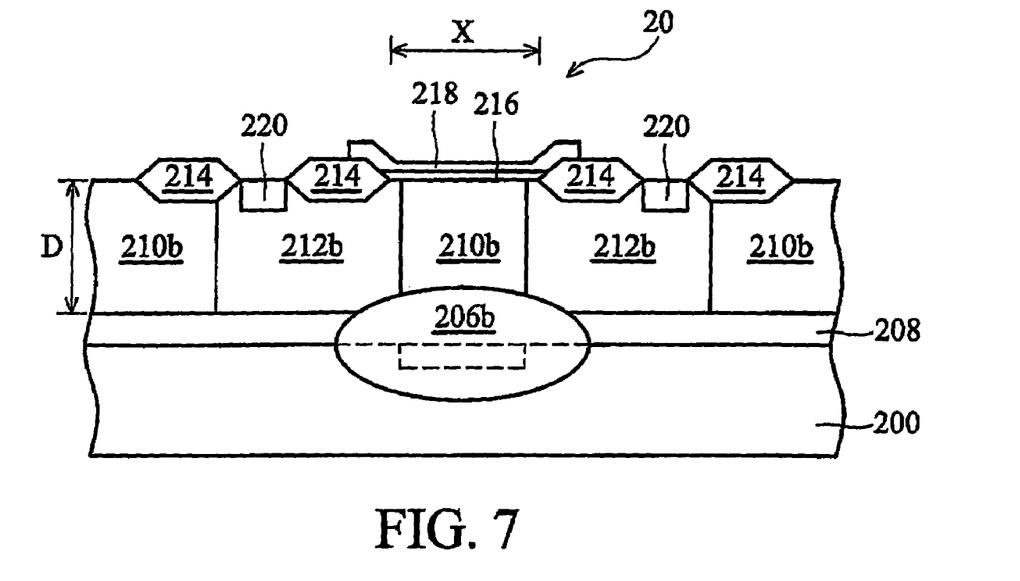

In FIG. 7, a plurality of isolation regions 214 are then respectively formed on proper locations of the surface of the described well regions. Next, a gate dielectric layer 216, a gate electrode layer 218, and N$^+$-doped contact node regions 220 are sequentially formed by known fabricating methods (not shown). Here, the isolation regions 214 are shown as field oxide (FOX) regions in FIG. 7 and can also be conventional shallow trench isolation (STI) regions. An N-channel transistor 20 with symmetric source and drain regions (referring to combination of the N well regions 212b and the N+-doped contact node regions 220) is thus formed on the silicon substrate 200. Through the additional P+-doped region 206b overlapping the lower portions of the P well region 210b below the gate dielectric layer 216, the P-type ion concentration therein is concentrated and the additional P+-doped region 206b acts as an anti-punch through region. The N-channel transistor 20 with the anti-punch through region can be operated on a higher bias more than 5 volts (V), even tens and a hundred volts (V), and the described punch-through effect found by the inventors can thus be prevented by the additional ion supplementation of the anti-punch through region and the N-channel transistor can act as a high-voltage (HV) transistor for use as a power source or driver for devices requiring higher working voltage.

Moreover, due to the additional ion supplementation of the anti-punch through region, the channel length X of the N-channel transistor 20 shown in FIG. 7 can be appropriately reduced. The size of the N-channel transistor sustaining higher working voltage can thus be reduced without affecting high-voltage (HV) operation performance thereof.

Figure 8:
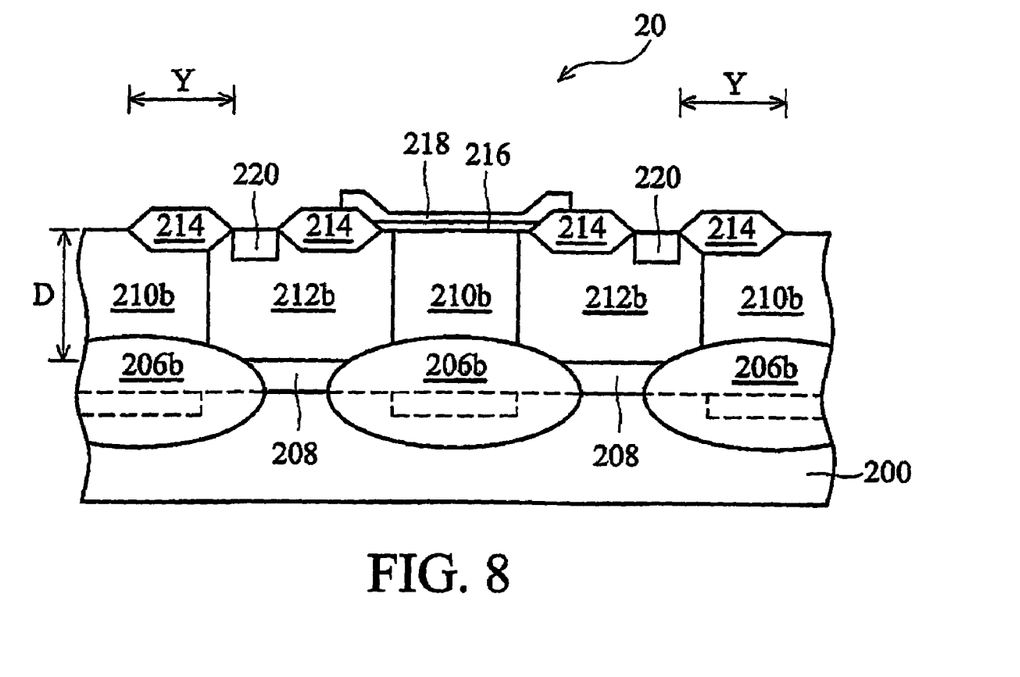

Additionally, as illustrated in FIG. 8, the anti-punch through region (referring to the P+-doped region 206b here) of the invention can be further formed in the lower portions of other P well regions 210b below the adjacent isolation regions 214 of the N-channel transistor 20 to supply additional ion concentration therein and an isolation structure for isolating devices with high voltage sustaining capability can thus be formed. Accordingly, the size Y of the adjacent isolation regions 214 can also be reduced due to the additional ion supplementation of the anti-punch through region therebelow.

Figure 9:
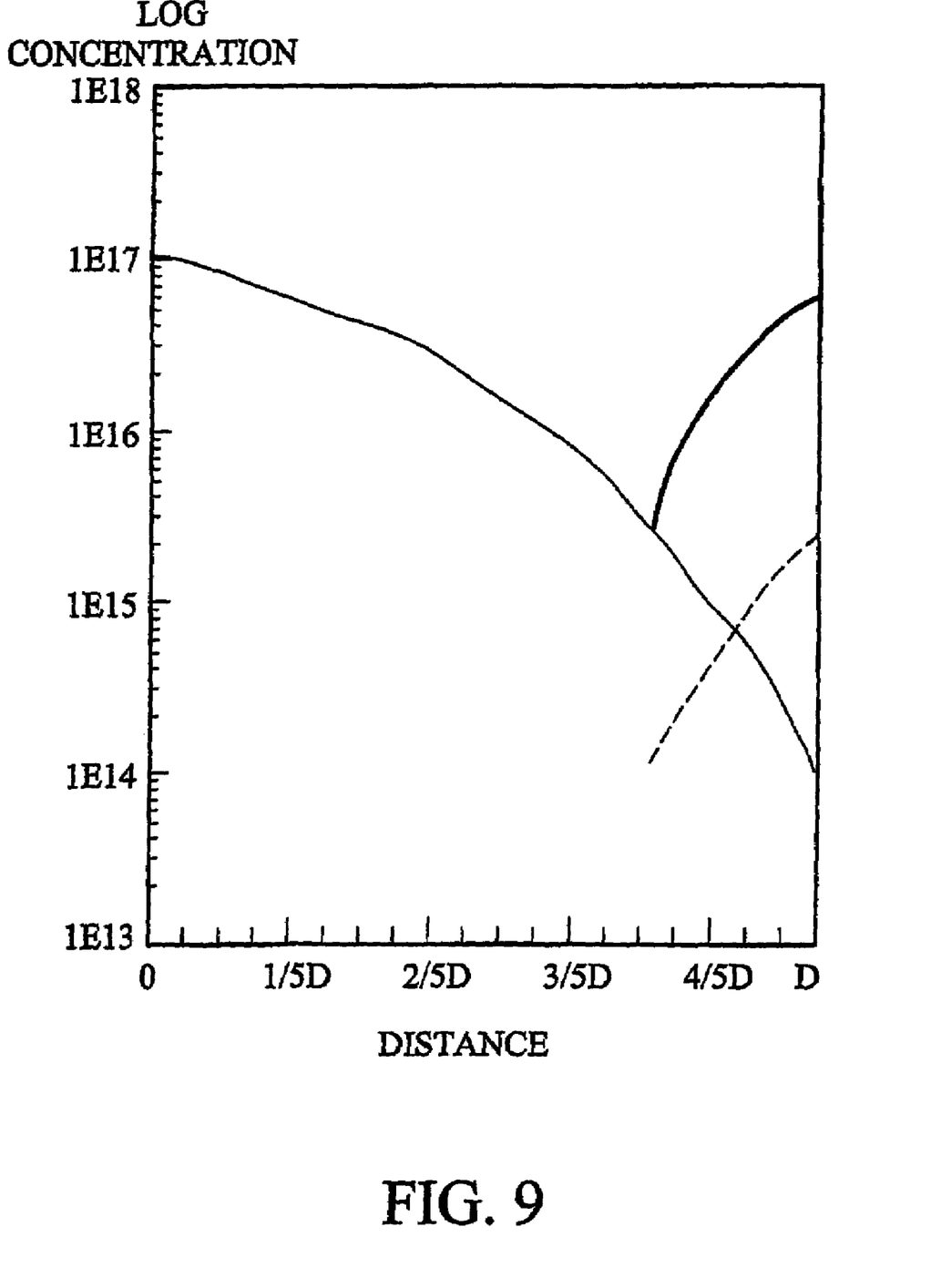
FIG. 9 shows an ion concentration profile of the P well region shown in FIGS. 7 and 8.

FIG. 9 shows a P-type ion concentration profile of the P well region shown in FIG. 8 for illustration only and is not intended to limit the invention to the quantities described therein. The vertical axis of FIG. 9 represents the ion concentration as the logarithm of the number of ions per cubic centimeter (atoms/cm$^2$). The horizontal axis of FIG. 9 represents the vertical distance into the P well region 210b with a depth D in the silicon layer 208 as shown in FIGS. 7 and 8. In FIG. 9, the ion concentration in the lower portion of the P well region 210b is supplied by the ions in the P+-doped region 206b shown by the in dashed line, and an overall ion concentration shown by the bold line, in the lower portion of the P well regions 210b are increased to a level of about 1E16 atoms/cm$^2$ and do not drop dramatically as shown in FIG. 3. When the N-channel transistor is under a higher bias (over 20~100 volts, up to tens or a hundred volts), a potential N-channel in the lower portion of the P well region 210b will not be formed and current generated by said potentially formed channel will not occur and the so-called punch through between the hetero-junctions of lower portion of the P well region 210b and adjacent N well regions 212b thereof can thus be prevented. Thus, the so-called punch through effect will not occur in the N-channel transistor 20 or the region below the isolation regions 214 and HV performance thereof is improved.

Moreover, the present invention provides a method for fabricating a P-channel transistor that can sustain higher operating voltage and prevent possible punch through effects between the hetero-junctions of the well regions. The fabrication steps are schematically illustrated in FIGS. 10 to 15.

Figure 10:
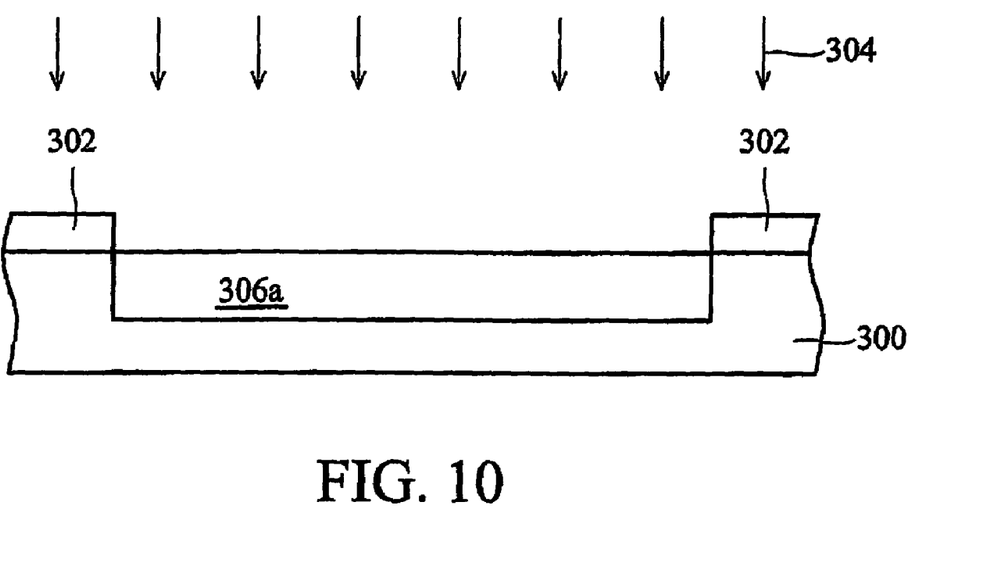
FIGS. 10 to 15 show schematic cross-sectional diagrams illustrating a method of forming a P-channel transistor with high-voltage sustaining capability of the invention.

In FIG. 10, a semiconductor substrate of a first conductivity type such as a P-type silicon substrate 300 is first provided. Patterned masking layers 302 are then formed on the silicon substrate 300 to expose a large portion of the surface of the silicon substrate 300. The patterned masking layers 302 can be photoresist (PR) layers or oxide layers. Next, an ion implantation process 304 is performed to implant N-type ions into the silicon substrate 300 to form a barrier layer 206a in the silicon substrate 300. Preferably, the N-type ions used in the ion implantation process 304 are antimony (Sb) ions.

Figure 11:
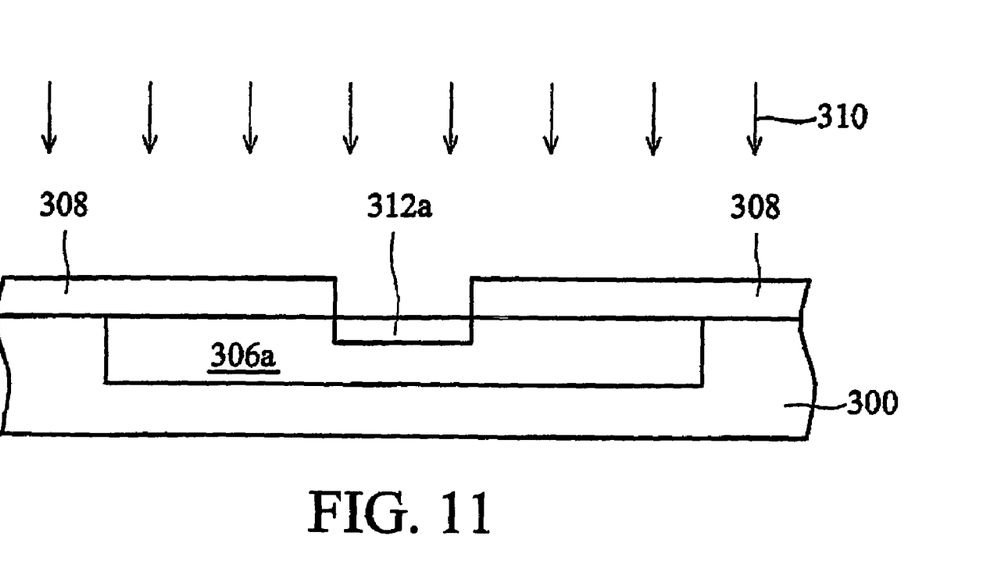

In FIG. 11, patterned second masking layers 308 are then formed on the silicon substrate 300 to expose a small portion of the surface of the barrier layer 306a. The patterned second masking layers 308 can be photoresist (PR) layers or oxide layers. Next, an ion implantation process 310 is performed to implant N-type ions into the barrier layer 306a to form a first doping layer 312a. The N-type ions used in the ion implantation process 310 can be phosphorus (P), arsenic (As), or stibium (Sb) ions and are preferably phosphorus ions.

Figure 12:
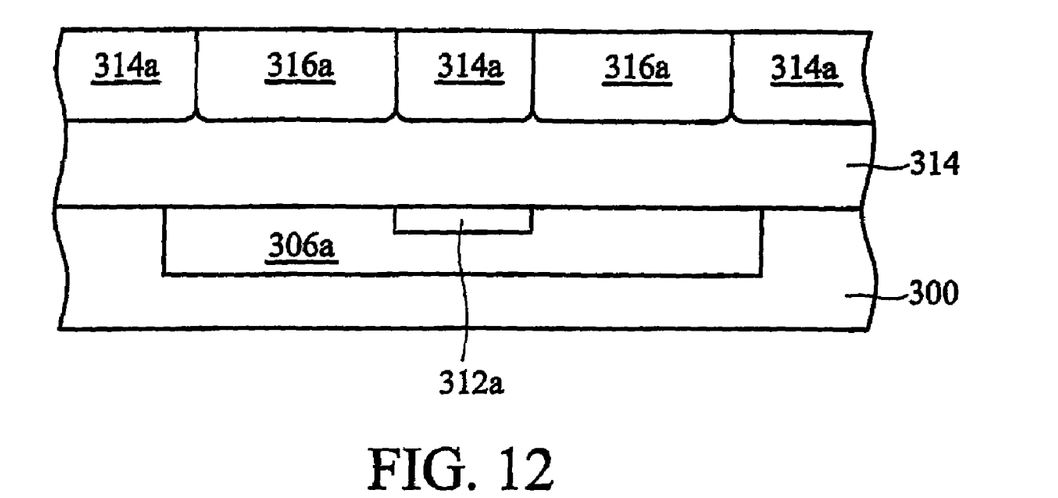

In FIG. 12, a semiconductor layer of the same conductivity type as the substrate, for example a P-doped silicon layer 314, is then formed on the silicon substrate 200 through, for example, an in-situ doping epitaxy process (not shown). Next, a plurality of N-doped layers 314a and P+-doped layers 316a are alternatively formed in the silicon layer 314 by proper masking processes and ion implantation steps (not shown). Here, one of the N-doped layers 314a is substantially formed above the first doping layer 312a.

Figure 13:
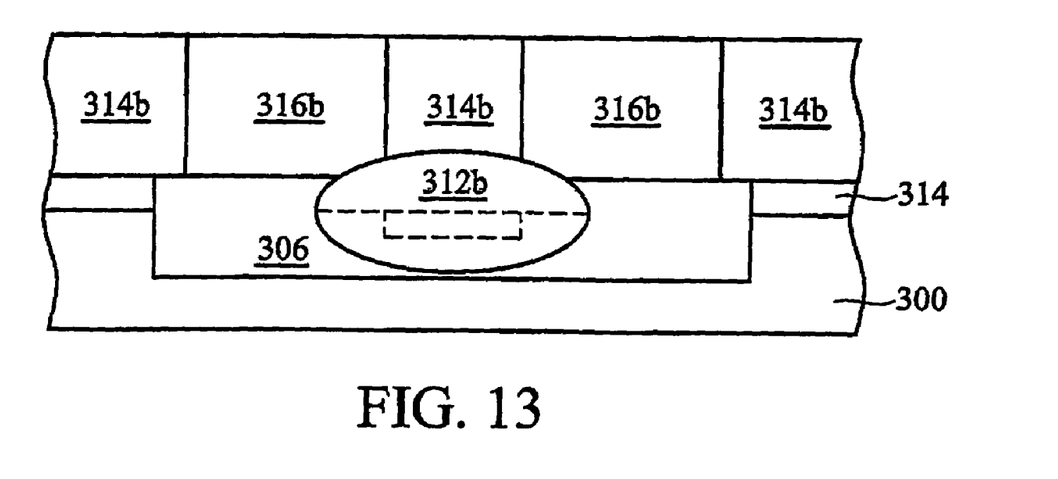

In FIG. 13, a thermal annealing process (not shown) is then performed on the described doped layers, the first doping layer 312a and the barrier layer 306a therebelow. A plurality of N well regions 314b and P well regions 316b are thus alternatively formed in the silicon layer 314. Moreover, an N+-doped region 312b is further diffused to overlap the lower portion of one of the N well regions 314b and portions of two adjacent P well regions 316b thereof. In addition, an N-type barrier region 306b is formed in portions of the silicon substrate 300 and the adjacent silicon layer 314 to surround the P well region 316b therein ensuring the operating function of a subsequently formed device.

Figure 14:
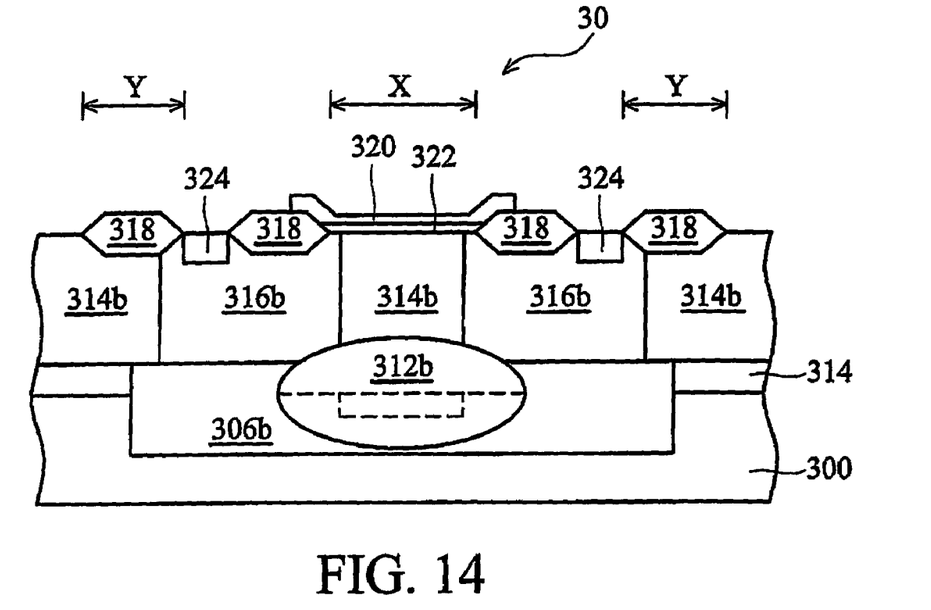

In FIG. 14, a plurality of isolation regions 318 are then respectively formed on proper locations of the surface of the described well regions. Next, a gate dielectric layer 320, a gate electrode layer 322, and P++-doped contact node regions 324 are sequentially formed by known fabricating methods (not shown). Here, the isolation regions 318 are shown as field oxide (FOX) regions in FIG. 14 and can also be conventional shallow trench isolation (STI) regions. A P-channel transistor 30 with a symmetric source and drain region (referring to the combination of P well regions 316b and the P++-doped contact node regions 324) is thus formed on the silicon substrate 300. Through the additional N+-doped region 312b overlapping the lower portions of the N well region 314b below the gate dielectric layer 320, the N-type ions therein are concentrated and the additional N+-doped region 312b acts as an anti-punch through region. The P-channel transistor 30 with the anti-punch through region can be operated with a higher bias of more than 5 volts (V), up to tens or a hundred volts (V), and the described punch-through effect found by the inventors can thus be prevented by the additional ion supplementation of the anti-punch through region and the P-channel transistor can act as a high-voltage (HV) transistor for use as a power source or driver for devices requiring a higher working voltage.

Moreover, due to the additional ion supplementation of the anti-punch through region, the channel length X of the P-channel transistor 30 shown in FIG. 14 can be appropriately reduced. The size of the P-channel transistor sustaining higher working voltage can thus be reduced without affecting the high-voltage (HV) operation performance thereof.

Figure 15:
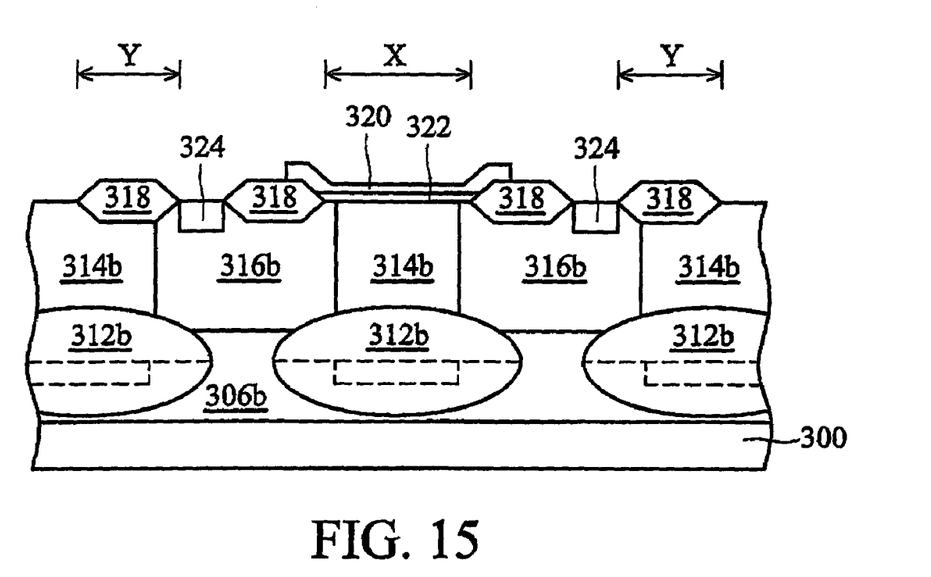

In addition, as shown in FIG. 15, the anti-punch through region (referring to the N⁺-doped region 312b here) of the invention can be further formed in the lower portions of P well regions 314b below the adjacent isolation regions 318 of the P-channel transistor 30 to supply additional ion concentration and an isolation structure for isolating devices with high voltage sustaining capability can thus be formed. Accordingly, the size Y of the adjacent isolation regions 318 can also be reduced due to the additional ion supplementation of the anti-punch through region therebelow. The ion supplementation of the N-type ion concentration profile of the N well region can be achieved and a similar profile with that shown in FIG. 9 can be obtained but is omitted here for simplicity.

In the present invention, semiconductor structures with high-voltage sustaining capability are disclosed. The semiconductor structure as shown in FIGS. 8 and 15 respectively includes a first well region of a first conductivity type. A pair of second well regions of a second conductivity type opposite to the first conductivity type are respectively disposed adjacent to the first well region and an anti-punch through region of the first conductivity type is disposed in at least the lower portion of the first well region to increase the doping concentration therein. The first conductivity can be N-type conductivity or P-type conductivity.

Moreover, an isolation region such a field oxide region or STI region can be further disposed on the surface of the first well region to form an isolation structure for protecting devices from interference during HV operations.

In addition, a pair of isolation regions is respectively disposed in the second well regions of the described semiconductor structure. A pair of doped regions of the second conductivity type are respectively disposed in the second well regions and a gate dielectric layer and a gate electrode are then sequentially disposed over the surface of the first well region to form a transistor with high-voltage sustaining capability. The first conductivity type can be N-type conductivity or P-type conductivity. When the first conductivity type is P-type conductivity, an N-channel transistor with high-voltage sustaining capability is thus formed, as the N-channel transistors 10 shown in FIGS. 7 and 8. On the contrary, when the first conductivity type is N-type conductivity, a P-channel transistor with high-voltage sustaining capability is thus formed, as the P-channel transistors 20 shown in FIGS. 14 and 15.

Due to the ion supplementation of the anti-punch through region disclosed in the present invention, the size of an isolation structure or an HV transistor can be further reduced without affecting the HV sustaining capability thereof. In addition, undesired effects such as punch-through effects can be prevented and current HV transistor yields can thus be increased. Methods and semiconductor structures disclosed in the invention can be adapted in the applications of other HV devices such as a device having asymmetric source/drain regions. Fabrication methods of the invention can be further combined by those skilled in the art and be applied in the application of a HV CMOS process.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure with high-voltage sustaining capability, comprising:
    a first well region of a first conduciviry type;
    a pair of second well regions of a second conductivity type opposite to the first conductivity type, wherein the first well region is disposed between the pair of second well regions and physically contacts therewith; and
    an anti-punch through region of the first conductivity type disposed in at least the lower portion of the first well region to increase the doping concentration therein, wherein the anti-punch through region physically contacts the second well regions.

2. The semiconductor structure as claimed in claim 1, wherein the anti-punch through region is further disposed in portions of the second well regions.

3. The semiconductor structure as claimed in claim 1, wherein the first well region and the second well regions sire disposed in a semiconductor layer formed on a semiconductor substrate.

4. The semiconductor structure as claimed in claim 1, further comprising:
    a pair of isolation regions respectively disposed in the second well regions;
    a pair of doped regions of the second conductivity type respectively disposed in the second well regions; and
    a gate dielectric layer and a gate electrode sequentially disposed over the surface of the first well region to form a transistor with high-voltage sustaining capability.

5. The semiconductor structure as claimed in claim 4, wherein the first conductivity type is P-type, the second conductivity type is N-type, and the transistor is an N-channel transistor.

6. The semiconductor structure as claimed in claim 5, wherein the N-channel transistor is a N-channel transistor having a symmetric source and drain regions.

7. The semiconductor structure as claimed in claim 4, wherein the first conductivity type is N-type, the second conductivity type is P-type, and the transistor is a P-channel transistor.

8. The semiconductor structure as claimed in claim 7, wherein the P-channel transistor is a P-channel transistor having a symmetric source and drain regions.

9. The semiconductor structure as claimed in claim 1, wherein the first conductivity type is P-type and the second conductivity type is N-type.

10. The semiconductor structure as claimed in claim 1, wherein the first conductivity type is N-type and the second conductivity type is P-type.

11. The semiconductor structure as claimed in claim 1, further comprising an isolation region disposed on the first well region to form an isolation structure.

* * * * *